US012391607B2

(12) United States Patent
Tavares Cortes et al.

(10) Patent No.: US 12,391,607 B2
(45) Date of Patent: Aug. 19, 2025

(54) COATING WITH SOLAR CONTROL PROPERTIES FOR A GLASS SUBSTRATE

(71) Applicant: Vidrio Plano de Mexico, S.A. de C.V., Nuevo León (MX)

(72) Inventors: Jose Luis Tavares Cortes, Nuevo León (MX); José Guadalupe Cid-Aguilar, Nuevo Leon (MX); Arturo Si Ming Lamshing Tai, Nuevo León (MX); Edgar Valverde-Chong, Tlalpan (MX); Jorge Sanchez-Gonzalez, Nuevo León (MX)

(73) Assignee: Vidrio Plano de México, S.A. de C.V., Nuevo León (MX)

( * ) Notice: Subject to any disclaimer, the term of this patent is extended or adjusted under 35 U.S.C. 154(b) by 138 days.

(21) Appl. No.: 17/945,726

(22) Filed: Sep. 15, 2022

(65) Prior Publication Data

US 2023/0024206 A1    Jan. 26, 2023

Related U.S. Application Data

(60) Division of application No. 16/291,180, filed on Mar. 4, 2019, now Pat. No. 11,485,679, which is a continuation of application No. 15/116,557, filed as application No. PCT/MX2014/000043 on Feb. 10, 2014, now Pat. No. 10,259,743.

(51) Int. Cl.
| *C23C 14/00* | (2006.01) |
| *C03C 17/36* | (2006.01) |
| *C23C 14/06* | (2006.01) |
| *C23C 14/08* | (2006.01) |

(Continued)

(52) U.S. Cl.
CPC ............ *C03C 17/366* (2013.01); *C03C 17/36* (2013.01); *C03C 17/3626* (2013.01); *C03C 17/3639* (2013.01); *C03C 17/3642* (2013.01); *C03C 17/3649* (2013.01); *C23C 14/0036* (2013.01); *C23C 14/0641* (2013.01); *C23C 14/083* (2013.01); *C23C 14/3407* (2013.01); *C23C 28/321* (2013.01); *C23C 28/34* (2013.01); *C23C 28/3455* (2013.01); *C03C 2218/153* (2013.01); *C03C 2218/155* (2013.01)

(58) Field of Classification Search
CPC .................................................. C03C 17/366
See application file for complete search history.

(56) References Cited

U.S. PATENT DOCUMENTS

| 8,286,395 B2 | 10/2012 | Mauvernay et al. |
| 9,102,565 B2 | 8/2015 | Durandeau et al. |

(Continued)

FOREIGN PATENT DOCUMENTS

| FR | 2992958 A1 | 1/2014 |
| WO | 2012095380 A1 | 7/2012 |

(Continued)

*Primary Examiner* — John J Brayton
(74) *Attorney, Agent, or Firm* — The Webb Law Firm

(57) ABSTRACT

The invention relates to a glass substrate including a stack of coating layers having control properties, in which stack comprises at least one niobium metal layer located between a layer of a dielectric material selected from $Si_3N_4$ or TiOx and a layer of a protective metal material selected from TIN or Ni—Cr, conferring solar control and heat resistance properties on the glass substrate.

13 Claims, 1 Drawing Sheet

(51) Int. Cl.
 *C23C 14/34* (2006.01)
 *C23C 28/00* (2006.01)

(56) References Cited

U.S. PATENT DOCUMENTS

| | | | | |
|---|---|---|---|---|
| 9,637,410 | B2* | 5/2017 | De Grazia | C03C 17/3686 |
| 2002/0192473 | A1* | 12/2002 | Gentilhomme | C03C 17/3618 |
| | | | | 359/359 |
| 2004/0086723 | A1 | 5/2004 | Thomsen et al. | |
| 2005/0079369 | A1 | 4/2005 | Stachowiak | |
| 2009/0263596 | A1 | 10/2009 | Lao et al. | |
| 2010/0279144 | A1 | 11/2010 | Frank et al. | |
| 2011/0027554 | A1* | 2/2011 | Gouardes | C03C 17/3681 |
| | | | | 428/213 |
| 2012/0164443 | A1* | 6/2012 | Durandeau | C03C 17/3618 |
| | | | | 428/428 |

FOREIGN PATENT DOCUMENTS

| | | |
|---|---|---|
| WO | 2013057424 A1 | 4/2013 |
| WO | 2014006322 A1 | 1/2014 |

\* cited by examiner

COATING WITH SOLAR CONTROL PROPERTIES FOR A GLASS SUBSTRATE

CROSS REFERENCE TO RELATED APPLICATIONS

This application is a divisional of U.S. patent application Ser. No. 16/291,180, filed on Mar. 4, 2019, which is a continuation of U.S. patent application Ser. No. 15/116,557, filed on Oct. 24, 2016, which is entitled to and claims priority to PCT/MX2014/000043, filed on Feb. 10, 2014, the disclosures of which in each case are incorporated herein by reference in their entireties.

FIELD OF THE INVENTION

The present invention relates to coatings with solar control properties deposited on glass for architectural, automotive, monolithic or laminated use, of the low-iron type, clear or tinted used in glazing for the construction industry mainly, through the process known as "sputtering" or also called cathode pulverizing. Glass having characteristics of mechanical strength and heat treatment strength, light transmittance from 5 to 60%, solar transmission from 5 to 40% and less than 0.5 solar factor.

BACKGROUND OF THE INVENTION

Glass used in buildings and vehicles, protects us generally from the environment (rain, wind, noise, etc.), allowing more pleasant conditions inside. However, ordinary glass does not protect from solar radiation, since it only absorbs a part of the UV radiation, reflecting a total of about 7% and transmitting much of the solar spectrum. In particular, in the case of the construction industry, the tendency is to use glass having solar control characteristics. This requires improvements in the properties of the glass (by means of coatings) to reduce entry of infrared radiation improving user comfort and reducing energy consumption.

The value added to the glass or other products can be increased depending on the functional properties conferred by its surface or a coating deposited thereon. Many phenomena that give functional characteristics to a material occur on the surface or in a region close to it. It is therefore possible to coat economical substrates (glass) with functional materials in the form of thin layers. Thus, the obtained product has the functional property of the coating and the characteristics of the substrate, particularly those of glass.

Solar control refers to the capacity to change the amount of transmitted or reflected solar radiation, in the near ultra-violet spectral ranges (UV; 300-380 nm), visible (VIS; 380-780 nm) and infrared (IR; 780-2500 nm). Low transmittance is generally pursued in UV and IR ranges, while the VIS transmittance may be high (>70%) or low, depending on the application.

In addition to blocking infrared radiation, glass and coating must have other properties, such as: high transmittance in the visible range (>70%), high mechanical strength, chemical resistance and weather resistance, it should be able to undergo heat treatments (tempering, bending), it must show a neutral color without iridescence, low dispersion and be low cost. The set of required properties makes development of such coatings a complex technological problem having great difficulty.

There are many choices for obtaining solar control properties. This is reflected in a lot of scientific articles, patents and patent applications existing on this matter. For example, a scientific publication on coatings with solar control properties, is the work "Solar heat reflective glass by sol-gel nanostructured multilayer coatings" by Z. Nagamedianova et al, published in the journal Optical Materials in 2011, Volume No. 33, pages 1999-2005; it describes commercial clear glass coated by the sol-gel method with three layers of oxides, $TiO_2$— $SiO_2$— $TiO_2$, which have the property to reflect the IRC. Transmittances are reported in the VIS>70%, high UV blocking (Tuv<35%) and high reflectivity (>60%) in the 800-950 nm interval.

With regards to patents, U.S. Pat. No. 5,242,560 "Heat treatable sputter-coated glass" held by Guardian Industries Corp. describes a glass coated by sputtering which can be heat treatable consisting of one layer of Ni alloyed with one or two layers of Sn oxide, and optionally one intermediate Al layer.

The US Patent Application Publication No. 2011/0236715 A1 is related to a "solar control coating layer with discontinuous metal" held by PPG Industries Ohio, Inc. In that application a coating is proposed deposited over at least a portion of a substrate, comprising a stack metallic layers alternating with a plurality of dielectric layers, wherein at least one of the metallic layers comprising discontinuous metallic regions.

In the British Patent (1971) No. 1241889 "Heat reflecting glass and method for manufacturing the same" owned by Asahi Glass Co., Ltd., a glass substrate which reflects heat and transmits visible light, which comprises a composite of a metal oxide layer ($TiO_2$, $Ta_2O_5$, $WO_3$, $ZrO_2$, $NB_2O_5$, $ThO_2$, $SnO_2$) having a higher index than glass, in which microscopic metallic Pd or Au particles are immersed, is claimed.

Furthermore, there are several methods of synthesis of coatings which include: sol-gel, pulsed laser deposition, vacuum evaporation, electron beam, cathode pulverization, plasma discharge and CVD. A known process for applying layers or thin film coatings on glass sheets involves depositing metals or compounds derived therefrom by ion bombardment (sputtering) in a controlled vacuum on the glass surface, the positive gas ions are accelerated towards the cathode, the high voltage between the cathode and anode causes the gas ions to strike plates with sufficient energy to release atomic particles adhering to the glass. Deposition may be higher or lower depending on the amount of gas used, power and speed of the process conveyor.

SUMMARY OF THE INVENTION

Considering the above technique, the present invention relates to a multilayer coating with solar control properties, which is deposited on glass, intended for architectural, automotive, monolithic or laminated use. The coating is composed of several layers of different semiconductor metal oxides for solar control whose visible light transmission varies from 5 to 60%, a solar transmission from 5 to 40% and less than 0.5 solar factor.

From the above, the present invention relates to a substrate (glass) coated with a stack of films or thin layers, which are superimposed on the substrate in a predetermined order, i.e., in a first embodiment comprising: a glass substrate; a dielectric material ($Si_3N_4$); a layer of infrared reflecting metal (Nb); a protective material alloy (Ni—Cr) for protecting the metal layer from oxidation; a layer of metal material (TiN) to improve the surface properties of the substrate, reinforcing the mechanical and chemical protection of the coating on the substrate; and a dielectric material ($Si_3N_4$). The thicknesses of the layers are selected so that the coating confers to glass the solar control properties described in the preceding paragraph.

In a second embodiment, the coating comprises: a dielectric material ($Si_3N_4$); a second material with dielectric properties ($TiO_2$); a layer of infrared reflective metal (Nb); a layer of metal material (TiN) to improve the surface properties of the substrate, reinforcing the mechanical and chemical protection of the coating on the substrate; and a dielectric material ($Si_3N_4$).

OBJECTIVES OF THE INVENTION

It is therefore a first objective of the present invention to provide a coating with solar control properties for a substrate, said coating comprising several layers of dielectric and metallic materials, said coating including a layer of an infrared reflective metal (Nb) located between a layer of a dielectric material and a layer of a metallic material protection, which provide solar control properties as well as heat and mechanical resistance to the glass substrate.

It is a further objective of the present invention to provide a coating with solar control properties which use to deposit said coating, the process known as "sputtering" or also called cathode pulverization.

A further objective of the present invention is to provide a coating with solar control properties having characteristics of mechanical strength and resistance to heat treatment, a light transmittance from 5 to 60%, a solar transmission from 5 to 40% and a solar factor less than 0.5.

It is another objective of the present invention to provide a coating with solar control properties that because it reduces solar radiation passing through the glass substrate, allows energy saving and comfort inside, due to the lower power in use of air conditioning systems.

These and other objectives and advantages of the coating with solar control properties as well as mechanical strength and heat resistance of the present invention, will be apparent to those skilled in the art, from the following detailed description thereof.

DETAILED DESCRIPTION OF THE INVENTION

The present invention describes coatings with solar control properties deposited on glass intended for architectural, automotive, monolithic or laminated use. Solar control refers to the ability to modify the amount of transmitted, reflected and absorbed solar radiation. Glass having characteristics of mechanical strength and heat treatment strength, light transmittance from 5 to 60%, solar transmission from 5 to 40% and a solar factor less than 0.5.

Figure 1:
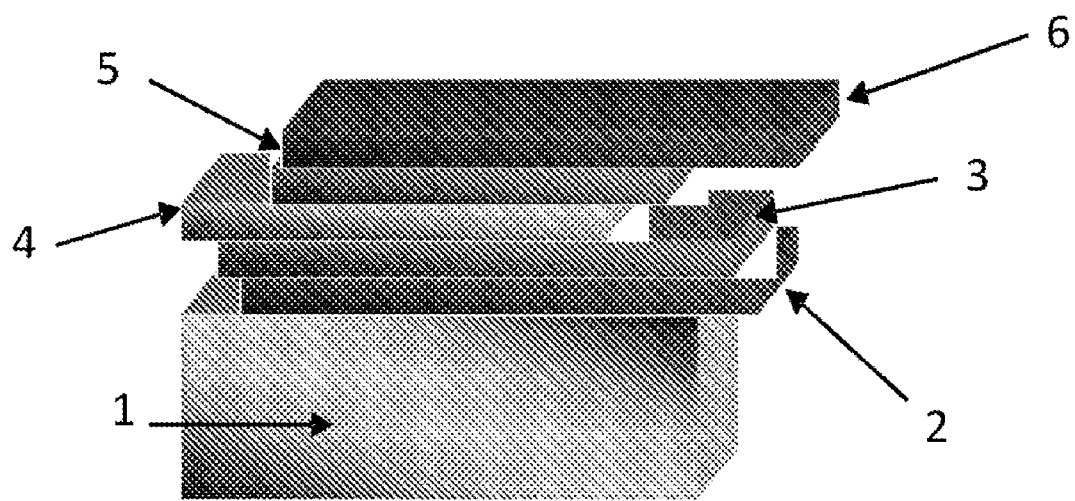
FIG. 1 shows the schematic diagram of a coating with solar control properties for a substrate, in accordance with a first embodiment of the present invention; and, FIG. 2 shows the schematic diagram of a coating with solar control properties to a substrate, in accordance with a second embodiment of the present invention.

In the example illustrated in FIG. 1, the CS solar control coating consists of five (5) layers: A substrate (1), on which a first layer (2) of a dielectric material such as $Si_3N_4$ with a thickness of 10 to 50 nm is deposited. This first layer also serves as a support for a metal layer (3), reflective to infrared, such as Nb, which is the metal layer conferring solar properties and thermal resistance to the configuration, since it is an element resistant to oxidation during tempering. The Nb thickness is approximately 2 to 40 nm. Subsequently, an alloy of protective material (4) preferably a Ni—Cr alloy, with a thickness of about 1 to 10 nm, is deposited on it for protecting the metal layer from oxidation. The Ni—Cr alloy protects the Nb layer during a sputtering process preventing its nitriding and modification of the optical properties of the material. Then a layer of metallic material (5), such as titanium nitride (TiN) is applied, with a thickness of about 5 to 20 nm, to improve the surface properties of the substrate, reinforcing the mechanical and chemical protection of the coating on the substrate; and finally, a dielectric material (6) such as $Si_3N_4$ (Silicon Nitride), with a thickness of about 10 to 50 nm, in order to increase solar control properties, particularly to adjust the transmittance in the visible range.

Figure 2:
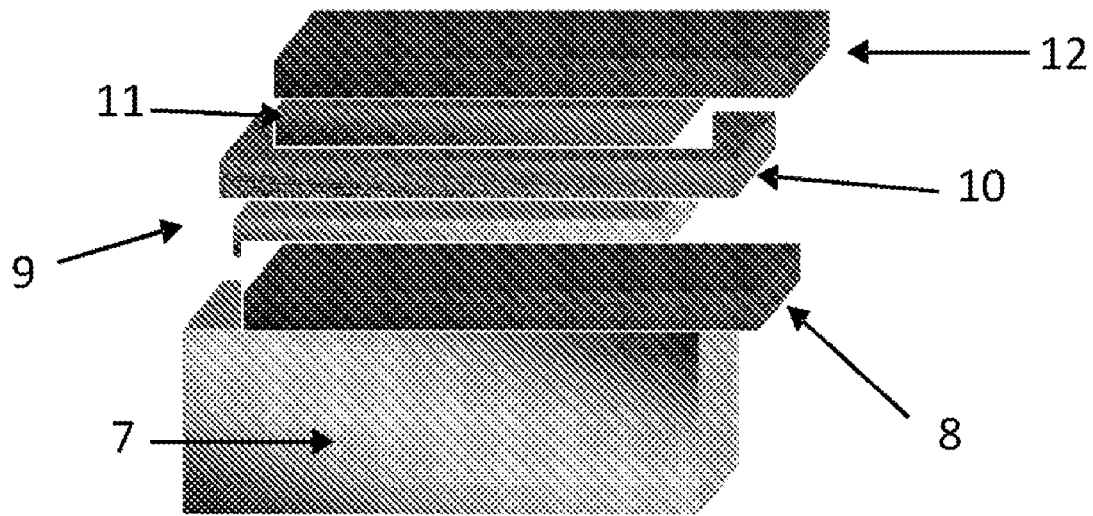

In the example illustrated in FIG. 2, a solar control coating CS, also formed of five layers, is shown schematically. In FIG. 2 a glass substrate (7) is shown, on which a first layer (8), corresponding to a dielectric material such as $Si_3N_4$, is deposited. Layer (8) can be applied with a thickness of 10 to 50 nm. Afterward a layer of diffusion barrier (9) is deposited, i.e. $TiO_2$, with a thickness between 1 and 20 nm. Then a metal layer (10) reflective to infrared, such as Nb, which is the metal layer conferring solar properties and thermal resistance to the configuration, because it is resistant to oxidation during tempering. The metal layer (10) can be applied with a thickness of 2 to 40 nm.

The following layer is a metallic material (11) such as Titanium Nitride (TiN), to improve the surface properties of the substrate, reinforcing the mechanical and chemical protection to the coating on the substrate. Said layer (11) can be applied with a thickness of between 5 and 20 nm; and finally, a dielectric material (12) such as $Si_3N_4$, with a thickness of between 10 and 50 nm, in order to increase solar control properties, in particular to adjust the transmittance in the visible range.

Based on the coatings described in FIGS. 1 and 2, tests were performed to measure the visible spectrum (380-780 nm) and generate values of vectors L*, a*, b* measured for transmission (transmitted color) and reflection (reflected color) on both surfaces; likewise, the parameters of visible light transmission or reflection (described as Y) according to the rules established by the International Commission on Illumination (C.I.E.) were determined for simulating daylight (Illuminant D65) to a 10° observer. Color differences (ΔE) were calculated using CIELAB (ISO 7724/3) $\Delta E = [(\Delta L^*)^2 + (\Delta a^*)^2 + (\Delta b^*)^2]^{0.5}$ Tables 1 to 4 show various tests according to the examples shown in FIGS. 1 and 2, which were performed with a speed of 1.0 meters/minute.

The precursor commercial material of Si, usually contains up to 10% of Al which, when reacting in nitrogen plasma (80% $N_2$ 20% Ar) produces $Si_3N_4$. The presence of Al is justified to improve the conductivity of Si that suffers by itself, additionally it provides stability to target against thermal shock during its use in the process. $Si_3N_4$ is a dielectric material that when applied in contact with glass, provides chemical resistance acting as a barrier that blocks the migration of $Na^+$ from glass during tempering and when applied to the upper layer provides mechanical strength (abrasion) and corrosion resistance (etching) and prevents migration of oxygen during tempering.

The TiN is applied from a Ti reactive cathode with nitrogen plasma (80% $N_2$-20% Ar) is widely used in solar control products such as Vitro AP8, which contains a stainless steel film and, on top of it, a coating of TiN; this product is used in the architectural market with characteristics of solar control, providing chemical and mechanical resistance, without being a hardenable coating. In the configuration described here, it is applied on the metal layer or Ni—Cr alloy complementing the functional layers of solar control, additionally, this film reinforces the mechanical and chemical protection of the coating.

Titanium dioxide ($TiO_2$) is applied via a ceramic cathode in an inert atmosphere (100% Ar). It acts as a barrier providing mechanical and chemical durability reinforcing the $Si_3N_4$ and niobium layer. The advantage of this material is that it does not affect the transmission of light, i.e. visibility properties are not modified. The function of this dielectric layer when applied below the functional metallic layer is to increase the diffusion of sodium in glass during tempering. Following the approach of the tests is shown in the following tables:

TABLE 1

| Test 1 Annealed sheet - Level 1 NiCr) | | | |
|---|---|---|---|
| Film/Test | Material | Deposition Gas | Power (kW) |
| Film 1 | SiAl | 20% Ar—80% $N_2$ | 24.0 |
| Film 2 | Nb | 100% Ar | 8.5 |
| Film 3 | NiCr | 100% Ar | 0.8 |
| Film 4 | Ti | 20% Ar—80% $N_2$ | 18.0 |
| Film 5 | SiAl | 20% Ar—80% $N_2$ | 30.0 |

TABLE 2

| Test 2 (Annealed sheet - Level 2 NiCr) | | | |
|---|---|---|---|
| Film/Test | Material | Deposition Gas | Power (kW) |
| Film 1 | SiAl | 20% Ar—80% N2 | 24.0 |
| Film 2 | Nb | 100% Ar | 8.5 |
| Film 3 | NiCr | 100% Ar | 1.5 |
| Film 4 | Ti | 20% Ar—80% N2 | 18.0 |
| Film 5 | SiAl | 20% Ar—80% N2 | 30.0 |

TABLE 3

| Test 3 (Annealed sheet - Level 1 TiOx) | | | |
|---|---|---|---|
| Film/Test | Material | Deposition Gas | Power (kW) |
| Film 1 | SiAl | 20% Ar—80% N2 | 24.0 |
| Film 2 | TiOx | 100% Ar | 14.0 |
| Film 3 | Nb | 100% Ar | 8.5 |
| Film 4 | Ti | 20% Ar—80% N2 | 18.0 |
| Film 5 | SiAl | 20% Ar—80% N2 | 30.0 |

TABLE 4

| Test 4 (Annealed sheet - Level 2 TiOx) | | | |
|---|---|---|---|
| Film/Test | Material | Deposition Gas | Power (kW) |
| Film 1 | SiAl | 20% Ar—80% N2 | 24.0 |
| Film 2 | TiOx | 100% Ar | 20.0 |
| Film 3 | Nb | 100% Ar | 8.5 |
| Film 4 | Ti | 20% Ar—80% N2 | 18.0 |
| Film 5 | SiAl | 20% Ar—80% N2 | 30.0 |

Once the different films were deposited on glass, each one of the sheets was characterized. Data generated from the readings on the test sheets with titanium oxide and nickel-chromium are as follows:

| Test 1 (Annealed sheet - Level 1 NiCr) | | | |
|---|---|---|---|
| Vector/Test | Transmitted color | Glass side reflected color | Film side reflected color |
| Y | 21.74 | 29.12 | 40.92 |
| L* | 53.75 | 60.89 | 70.12 |
| a* | −2.12 | −3.69 | 2.55 |
| b* | −2.39 | −4.46 | 15.44 |

| Test 2 (Annealed sheet - Level 2 NiCr) | | | |
|---|---|---|---|
| Vector/Test | Transmitted color | Glass side reflected color | Film side reflected color |
| Y | 20.47 | 30.48 | 41.84 |
| L* | 52.36 | 62.07 | 70.76 |
| a* | −2.14 | −3.68 | 2.71 |
| b* | −2.45 | −3.88 | 16.64 |

| Test 3 (Annealed sheet - Level 1 TiOx) | | | |
|---|---|---|---|
| Vector/Test | Transmitted color | Glass side reflected color | Film side reflected color |
| Y | 23.15 | 25.71 | 43.48 |
| L* | 55.23 | 57.76 | 71.88 |
| a* | −2.33 | −3.41 | 2.29 |
| b* | −3.55 | −2.26 | 14.72 |

| Test 4 (Annealed sheet - Level 2 TiOx) | | | |
|---|---|---|---|
| Vector/Test | Transmitted color | Glass side reflected color | Film side reflected color |
| Y | 23.93 | 23.58 | 44.91 |
| L* | 56.02 | 55.67 | 72.83 |
| a* | −2.35 | −3.41 | 1.9 |
| b* | −4.38 | 0.05 | 14.32 |

After analyzing the results, tempering tests were performed at 700° C. for 5 minutes (6 mm light substrate) with tests 1, 2, 3 and 4 where titanium oxide and nickel-chromium were added, for subsequently characterizing them. The results are shown below:

| Vector/Test | Transmitted color (annealed) | Transmitted color (tempered) | Glass side reflected color (annealed) | Glass side reflected color (tempered) | Film side reflected color (annealed) | Film side reflected color (tempered) |
|---|---|---|---|---|---|---|
| | | | Test 1 Level 1 NiCr | | | |
| Y | 19.61 | 19.93 | 33.16 | 29.97 | 40.74 | 29.45 |
| L* | 51.39 | 51.76 | 64.29 | 61.63 | 69.99 | 61.17 |
| a* | −1.95 | −1.64 | −3.37 | −2.56 | 2.67 | 1.99 |
| b* | −2.6 | −3.96 | −3.16 | −3.03 | 18.38 | 16.28 |
| ΔE | 1.44 | | 1.78 | | 9.10 | |
| | | | Test 2 Level 2 NiCr | | | |
| Y | 20.47 | 18.83 | 30.48 | 30.7 | 41.84 | 53.9 |
| L* | 52.36 | 50.49 | 62.07 | 62.26 | 70.76 | 78.41 |
| a* | −2.14 | −0.59 | −3.68 | −3.04 | 2.71 | 2.23 |
| b* | −2.45 | −3.66 | −3.88 | −2.59 | 16.64 | 17.44 |
| ΔE | 2.74 | | 1.52 | | 7.83 | |
| | | | Test 3 Level 1 TiOx | | | |
| Y | 23.15 | 22.03 | 25.71 | 28.5 | 44.91 | 47.57 |
| L* | 55.23 | 54.06 | 57.76 | 60.34 | 72.83 | 74.56 |
| a* | −2.33 | −1.08 | −3.41 | −3.15 | 1.9 | 2.7 |
| b* | −3.55 | −4.23 | −2.26 | −1.29 | 14.32 | 18.7 |
| ΔE | 1.86 | | 2.93 | | 5.62 | |
| | | | Test 4 Level 2 TiOx | | | |
| Y | 23.93 | 21.7 | 23.58 | 27.22 | 44.91 | 49.27 |
| L* | 56.02 | 53.71 | 55.67 | 59.18 | 72.83 | 75.62 |
| a* | −2.35 | −1.07 | −3.41 | −2.79 | 1.9 | 2.64 |
| b* | −4.38 | −4.5 | 0.05 | −0.44 | 14.32 | 18.15 |
| ΔE | 2.52 | | 3.55 | | 4.83 | |

As can be noted, tests 3 and 4 show good stability in the transmitted color and reflected color values in the glass side, coupled with a significant improvement shown in stability of visible reflection values in the film side (Y). In the case of test 2 (Level 2 NiCr), the main difference observed is the reflection level change in the film side (Y) and consequently the L* vector. This change is tolerable as long as vectors a* and b* remain stable as well as the transmitted color and reflected color values in the glass side, which would lead to a change in hue tolerable to the human eye. On the other hand, in Test 3 (Level 1 TiOx) the main change is attributed to variations in the L* and b* vectors reflected by the film side surface, resulting in changes in hue of film that might be noticeable. From the above it is shown that incorporation of TiOx and NiCr materials brings significant improvements in the performance of the film during tempering giving greater protection to the functional layer of Niobium against temperature, sodium migration from the glass surface and considerable changes in film color.

Tempering tests 1 to 4 were subjected to accelerated weathering tests; moisture testing at high temperature; etching tests in salt spray chamber; immersion etching tests; and abrasion tests Tests 1, 2, 3 and 4 were subjected to accelerated weathering to validate the durability of the film using a Singleton brand saline chamber according to ASTM D1117 and ISO 9017 standards, where tempered sheets of each test were exposed to a corrosive environment consisting in a fog of 20% NaCl at 35° C. for 750 hours and 95% humidity. Sheets were monitored every 24 hours to visualize the possible presence of defects in the film (lines, pinhole, degradation, etc.) and every 10 days readings were made on the product to visualize changes in film properties. The results are shown below:

| Test 1 - SiNx/Nb/NiCr/Tinx/SiNx (Level 1 NiCr) | | | | | | | | | |
|---|---|---|---|---|---|---|---|---|---|
| | HCl 0.1N | | | HNO$_3$ 0.1N | | | H$_2$SO$_4$ 0.1N | | |
| | Before | After | Change | Before | After | Change | Before | After | Change |
| Transmitted Color | | | | | | | | | |
| Y | 18.81 | 18.58 | −0.23 | 18.81 | 18.94 | 0.13 | 18.81 | 20.47 | 1.66 |
| L* | 50.47 | 50.19 | −0.28 | 50.47 | 50.62 | 0.15 | 50.47 | 52.36 | 1.89 |
| a* | −0.57 | −1.06 | −0.49 | −0.57 | −1.02 | −0.45 | −0.57 | −0.86 | −0.29 |
| b* | −3.50 | −3.82 | −0.32 | −3.50 | −3.73 | −0.23 | −3.50 | −3.35 | 0.15 |
| ΔE | | 0.65 | | | 0.53 | | | 1.92 | |
| Glass surface reflected color | | | | | | | | | |
| Y | 30.21 | 31.01 | 0.80 | 30.21 | 30.37 | 0.16 | 30.21 | 30.12 | −0.09 |
| L* | 61.84 | 62.51 | 0.67 | 61.84 | 61.97 | 0.13 | 61.84 | 61.76 | −0.08 |
| a* | −3.06 | −3.07 | −0.01 | −3.06 | −3.10 | −0.04 | −3.06 | −3.07 | −0.01 |
| b* | −2.41 | −2.63 | −0.22 | −2.41 | −2.67 | −0.26 | −2.41 | −2.97 | −0.56 |
| ΔE | | 0.71 | | | 0.29 | | | 0.57 | |
| Film surface reflected color | | | | | | | | | |
| Y | 54.08 | 56.80 | 2.72 | 54.08 | 57.41 | 3.33 | 54.08 | 55.07 | 0.99 |
| L* | 78.51 | 80.07 | 1.56 | 78.51 | 80.41 | 1.90 | 78.51 | 79.08 | 0.57 |
| a* | 1.97 | 2.21 | 0.24 | 1.97 | 2.24 | 0.27 | 1.97 | 1.76 | −0.21 |
| b* | 16.54 | 18.15 | 1.61 | 16.54 | 16.83 | 0.29 | 16.54 | 19.54 | 3.00 |
| ΔE | | 2.25 | | | 1.94 | | | 3.06 | |
| | NaOH 0.1N | | | NH$_4$OH 0.5N | | | | | |
| | Before | After | Change | Before | After | Change | | | |
| Transmitted color | | | | | | | | | |
| Y | 18.81 | 17.09 | −1.72 | 18.81 | 17.29 | −1.52 | | | |
| L* | 50.47 | 48.37 | −2.10 | 50.47 | 48.63 | −1.84 | | | |
| a* | −0.57 | −0.89 | −0.32 | −0.57 | −0.43 | 0.14 | | | |
| b* | −3.50 | −1.80 | 1.70 | −3.50 | −1.83 | 1.67 | | | |
| ΔE | | 2.72 | | | 2.49 | | | | |
| Glass surface reflected color | | | | | | | | | |
| Y | 30.21 | 27.03 | −3.18 | 30.21 | 26.30 | −3.91 | | | |
| L* | 61.84 | 59.00 | −2.84 | 61.84 | 58.32 | −3.52 | | | |
| a* | −3.06 | −2.62 | 0.44 | −3.06 | −2.56 | 0.50 | | | |
| b* | −2.41 | −1.50 | 0.91 | −2.41 | −1.41 | 1.00 | | | |
| ΔE | | 3.01 | | | 3.69 | | | | |
| Film surface reflected color | | | | | | | | | |
| Y | 54.08 | 75.12 | 21.04 | 54.08 | 71.92 | 17.84 | | | |
| L* | 78.51 | 89.45 | 10.94 | 78.51 | 87.93 | 9.42 | | | |
| a* | 1.97 | 1.03 | −0.94 | 1.97 | 0.71 | −1.26 | | | |
| b* | 16.54 | 7.78 | −8.76 | 16.54 | 6.70 | −9.84 | | | |
| ΔE | | 14.05 | | | 13.68 | | | | |

| Test 2 - SiNx/Nb/NiCr/TiNx/SiNx (Level 2 NiCr) | | | | | | | | | |
|---|---|---|---|---|---|---|---|---|---|
| | HCl 0.1N | | | HNO₃ 0.1N | | | H₂SO₄ 0.1N | | |
| | Before | After | Change | Before | After | Change | Before | After | Change |
| Transmitted Color | | | | | | | | | |
| Y | 18.83 | 17.23 | −1.60 | 18.83 | 18.07 | −0.76 | 18.83 | 19.15 | 0.32 |
| L* | 50.49 | 48.55 | −1.94 | 50.49 | 49.58 | −0.91 | 50.49 | 50.86 | 0.37 |
| a* | −0.59 | −0.88 | −0.29 | −0.59 | −1.05 | −0.46 | −0.59 | −0.69 | −0.10 |
| b* | −3.66 | −3.50 | 0.16 | −3.66 | −3.90 | −0.24 | −3.66 | −3.08 | 0.58 |
| ΔE | | 1.97 | | | 1.05 | | | 0.70 | |
| Glass surface reflected color | | | | | | | | | |
| Y | 30.70 | 31.31 | 0.61 | 30.70 | 31.51 | 0.81 | 30.70 | 31.10 | 0.40 |
| L* | 66.26 | 62.77 | 0.51 | 62.26 | 62.94 | 0.68 | 62.26 | 62.60 | 0.34 |
| a* | −3.04 | −2.91 | 0.13 | −3.04 | −2.99 | 0.05 | −3.04 | −2.97 | 0.07 |
| b* | −2.59 | −1.88 | 0.71 | −2.59 | −2.29 | 0.30 | −2.59 | −2.33 | 0.26 |
| ΔE | | 0.88 | | | 0.74 | | | 0.43 | |
| Film surface reflected color | | | | | | | | | |
| Y | 53.90 | 59.87 | 5.97 | 53.90 | 57.86 | 3.96 | 53.90 | 58.66 | 4.76 |
| L* | 78.41 | 81.77 | 3.36 | 78.41 | 80.66 | 2.25 | 78.41 | 81.11 | 2.70 |
| a* | 2.23 | 1.67 | −0.56 | 2.23 | 2.42 | 0.19 | 2.23 | 2.18 | −0.05 |
| b* | 17.44 | 15.44 | −2.00 | 17.44 | 18.26 | 0.82 | 17.44 | 17.01 | −0.43 |
| ΔE | | 3.95 | | | 2.40 | | | 2.73 | |
| | NaOH 0.1N | | | NH₄OH 0.5N | | | | | |
| | Before | After | Change | Before | After | Change | | | |
| Transmitted color | | | | | | | | | |
| Y | 18.83 | 16.62 | −2.21 | 18.83 | 15.14 | −3.69 | | | |
| L* | 50.49 | 47.78 | −2.71 | 50.49 | 45.82 | −4.67 | | | |
| a* | −0.59 | −0.92 | −0.33 | −0.59 | −0.48 | 0.11 | | | |
| b* | −3.66 | −2.31 | 1.35 | −3.66 | −1.68 | 1.98 | | | |
| ΔE | | 3.05 | | | 5.07 | | | | |
| Glass surface reflected color | | | | | | | | | |
| Y | 30.70 | 27.50 | −3.20 | 30.70 | 27.85 | −2.85 | | | |
| L* | 62.26 | 59.43 | −2.83 | 62.26 | 59.76 | −2.50 | | | |
| a* | −3.04 | −2.48 | 0.56 | −3.04 | −2.57 | 0.47 | | | |
| b* | −2.59 | −1.07 | 1.52 | −2.59 | −0.67 | 1.92 | | | |
| ΔE | | 3.26 | | | 3.19 | | | | |
| Film surface reflected color | | | | | | | | | |
| Y | 53.90 | 75.12 | 21.22 | 53.90 | 77.57 | 23.67 | | | |
| L* | 78.41 | 89.45 | 11.04 | 78.41 | 90.58 | 12.17 | | | |
| a* | 2.23 | 1.16 | −1.07 | 2.23 | 0.79 | −1.44 | | | |
| b* | 17.44 | 9.22 | −8.22 | 17.44 | 6.58 | −10.86 | | | |
| ΔE | | 13.81 | | | 16.37 | | | | |

| Test 3 - SiNx/TiOx/Nb/Tinx/SiNx (Level 1 TiOx) | | | | | | | | | |
|---|---|---|---|---|---|---|---|---|---|
| | HCl 0.1N | | | HNO₃ 0.1N | | | H₂SO₄ 0.1N | | |
| | Before | After | Change | Before | After | Change | Before | After | Change |
| Transmitted Color | | | | | | | | | |
| Y | 22.03 | 22.16 | 0.13 | 22.03 | 21.46 | −0.57 | 22.03 | 21.27 | −0.76 |
| L* | 54.06 | 54.20 | 0.14 | 54.06 | 53.45 | −0.61 | 54.06 | 53.24 | −0.82 |
| a* | −1.08 | −1.42 | −0.34 | −1.08 | −1.31 | −0.23 | −1.08 | −1.37 | −0.29 |
| b* | −4.23 | −4.31 | −0.08 | −4.23 | −4.28 | −0.05 | −4.23 | −4.41 | −0.18 |
| ΔE | | 0.38 | | | 0.65 | | | 0.89 | |
| Glass surface reflected color | | | | | | | | | |
| Y | 28.50 | 28.47 | −0.03 | 28.50 | 28.78 | 0.28 | 28.50 | 29.68 | 1.18 |
| L* | 60.34 | 60.31 | −0.03 | 60.34 | 60.59 | 0.25 | 60.34 | 61.38 | 1.04 |
| a* | −3.15 | −3.11 | 0.04 | −3.15 | −3.19 | −0.04 | −3.15 | −3.11 | 0.04 |
| b* | −1.29 | −1.79 | −0.50 | −1.29 | −1.38 | −0.09 | −1.29 | −1.70 | −0.41 |
| ΔE | | 0.50 | | | 0.27 | | | 1.12 | |

Test 3 - SiNx/TiOx/Nb/Tinx/SiNx (Level 1 TiOx)

Film surface reflected color

|    | | | | | | | | | |
|----|------|------|-------|------|------|-------|------|------|-------|
| Y  | 47.57 | 49.52 | 1.95  | 47.57 | 52.92 | 5.35  | 47.57 | 49.89 | 2.32  |
| L* | 74.56 | 75.78 | 1.22  | 74.56 | 77.83 | 3.27  | 74.56 | 76.00 | 1.44  |
| a* | 2.70  | 2.48  | −0.22 | 2.70  | 2.70  | 0.00  | 2.70  | 2.24  | −0.46 |
| b* | 18.70 | 18.70 | 0.00  | 18.70 | 18.09 | −0.61 | 18.70 | 20.33 | 1.63  |
| ΔE |       | 1.24  |       |       | 3.33  |       |       | 2.22  |       |

|    | NaOH 0.1N | | | NH4OH 0.5N | | |
|----|--------|-------|--------|--------|-------|--------|
|    | Before | After | Change | Before | After | Change |

Transmitted color

|    |       |       |       |       |       |       |
|----|-------|-------|-------|-------|-------|-------|
| Y  | 22.03 | 23.51 | 1.48  | 22.03 | 17.62 | −4.41 |
| L* | 54.06 | 55.59 | 1.53  | 54.06 | 49.04 | −5.02 |
| a* | −1.08 | −1.32 | −0.24 | −1.08 | −0.77 | 0.31  |
| b* | −4.23 | −1.96 | 2.27  | −4.23 | −1.85 | 2.38  |
| ΔE |       | 2.75  |       |       | 5.56  |       |

Glass surface reflected color

|    |       |       |       |       |       |       |
|----|-------|-------|-------|-------|-------|-------|
| Y  | 28.50 | 22.85 | −5.65 | 28.50 | 26.02 | −2.48 |
| L* | 60.34 | 54.92 | −5.42 | 60.34 | 58.06 | −2.28 |
| a* | −3.15 | −2.62 | 0.53  | −3.15 | −2.60 | 0.55  |
| b* | −1.29 | −1.47 | −0.18 | −1.29 | −0.07 | 1.22  |
| ΔE |       | 5.45  |       |       | 2.64  |       |

Film surface reflected color

|    |       |       |        |       |       |        |
|----|-------|-------|--------|-------|-------|--------|
| Y  | 47.57 | 63.23 | 15.66  | 47.57 | 72.04 | 24.47  |
| L* | 74.56 | 83.57 | 9.01   | 74.56 | 87.99 | 13.43  |
| a* | 2.70  | 1.37  | −1.33  | 2.70  | 0.96  | −1.74  |
| b* | 18.70 | 8.38  | −10.32 | 18.70 | 6.23  | −12.47 |
| ΔE |       | 13.76 |        |       | 18.41 |        |

Test 4 - SiNx/TiOx/Nb/TiNx/SiNx (Level 2 TiOx)

|    | HCl 0.1N | | | HNO3 0.1N | | | H2SO4 0.1N | | |
|----|--------|-------|--------|--------|-------|--------|--------|-------|--------|
|    | Before | After | Change | Before | After | Change | Before | After | Change |

Transmitted Color

|    |       |       |       |       |       |       |       |       |       |
|----|-------|-------|-------|-------|-------|-------|-------|-------|-------|
| Y  | 21.70 | 22.97 | 1.27  | 21.70 | 21.27 | −0.43 | 21.70 | 21.09 | 0.21  |
| L* | 53.71 | 55.05 | 1.34  | 53.71 | 53.24 | −0.47 | 53.71 | 53.94 | 0.23  |
| a* | −1.07 | −1.52 | −0.45 | −1.07 | −1.45 | −0.38 | −1.07 | −1.39 | −0.32 |
| b* | −4.50 | −4.65 | −0.15 | −4.50 | −4.58 | −0.08 | −4.50 | −4.52 | −0.02 |
| ΔE |       | 1.42  |       |       | 0.61  |       |       | 0.39  |       |

Glass surface reflected color

|    |       |       |       |       |       |       |       |       |       |
|----|-------|-------|-------|-------|-------|-------|-------|-------|-------|
| Y  | 27.22 | 27.99 | 0.77  | 27.22 | 28.17 | 0.95  | 27.22 | 28.20 | 0.98  |
| L* | 59.18 | 59.88 | 0.70  | 59.18 | 60.04 | 0.86  | 59.18 | 60.07 | 0.89  |
| a* | −2.79 | −3.41 | −0.62 | −2.79 | −4.47 | −1.68 | −2.79 | −3.05 | −0.26 |
| b* | −0.44 | −0.10 | 0.34  | −0.44 | 3.05  | 3.49  | −0.44 | −0.35 | 0.09  |
| ΔE |       | 2.49  |       |       | 1.90  |       |       | 1.20  |       |

Film surface reflected color

|    |       |       |       |       |       |       |       |       |       |
|----|-------|-------|-------|-------|-------|-------|-------|-------|-------|
| Y  | 49.27 | 48.87 | −0.40 | 49.27 | 51.81 | 2.54  | 49.27 | 51.16 | 1.89  |
| L* | 75.62 | 75.37 | −0.25 | 75.62 | 77.17 | 1.55  | 75.62 | 76.78 | 1.16  |
| a* | 2.64  | 3.30  | 0.66  | 2.64  | 2.92  | 0.28  | 2.64  | 2.91  | 0.27  |
| b* | 18.15 | 20.54 | 2.39  | 18.15 | 19.21 | 1.06  | 18.15 | 18.30 | 0.15  |
| ΔE |       | 2.49  |       |       | 1.90  |       |       | 1.20  |       |

|    | NaOH 0.1N | | | NH4OH 0.5N | | |
|----|--------|-------|--------|--------|-------|--------|
|    | Before | After | Change | Before | After | Change |

Transmitted color

|    |       |       |      |       |       |       |
|----|-------|-------|------|-------|-------|-------|
| Y  | 21.70 | 23.42 | 1.72 | 21.70 | 17.86 | −3.84 |
| L* | 53.71 | 55.50 | 1.79 | 53.71 | 49.33 | −4.38 |

| Test 4 - SiNx/TiOx/Nb/TiNx/SiNx (Level 2 TiOx) | | | | | |
|---|---|---|---|---|---|
| a* | −1.07 | −1.41 | −0.34 | −1.07 | −0.87 | 0.20 |
| b* | −4.50 | −2.53 | 1.97 | −4.50 | −2.09 | 2.41 |
| ΔE | | 2.68 | | | 5.00 | |
| Glass surface reflected color | | | | | |
| Y | 27.22 | 22.15 | −5.07 | 27.22 | 25.01 | −2.21 |
| L* | 59.18 | 54.18 | −5.00 | 59.18 | 57.09 | −2.09 |
| a* | −2.79 | −2.50 | 0.29 | −2.79 | −2.54 | 0.25 |
| b* | −0.44 | 0.07 | 0.51 | −0.44 | 1.12 | 1.56 |
| ΔE | | 5.03 | | | 2.62 | |
| Film surface reflected color | | | | | |
| Y | 49.27 | 61.67 | 12.40 | 49.27 | 70.71 | 21.44 |
| L* | 75.62 | 82.74 | 7.12 | 75.62 | 87.34 | 11.72 |
| a* | 2.64 | 1.61 | −1.03 | 2.64 | 1.13 | −1.51 |
| b* | 18.15 | 9.55 | −8.60 | 18.15 | 6.38 | −11.77 |
| ΔE | | 11.21 | | | 16.68 | |

The four configurations (tests 1, 2, 3 and 4) proved to be highly resistant when exposed to acids and all show very small variations in light transmittance (Y) and all color parameters (ΔE) are kept below 5.0 making it a stable product when submitted to etching. Furthermore, when exposed to bases, the film shows a greater resistance to NaOH 0.1N than to NH$_4$OH 0.5N, especially in tests where NiCr was added as a protective film. NiCr tests show acceptable variations in light transmission, and transmission and reflection color parameters (ΔE) in glass side remain below 5.0. In the film side a change in hue can be seen, due to the reaction occurring between the basic solutions and the film. No defects such as lines, pinhole or peeling of the film occurred, only the change in hue inherent to the chemical reaction with the bases, whereby it is concluded that the NiCr configurations are resistant to chemical attack from acids but slightly affectable by alkaline solutions in prolonged periods.

Once the film resistance to chemical attack by immersion on tempered probes (test 1, 2, 3 and 4) was validated, an additional chemical attack test was performed according to the procedure described by ISO 9227 standard followed by the CAAS test methodology where the film is exposed to a fogging solution of 0.026% bihidrated cupric chloride and 5% sodium chloride solution. The glass sheets were exposed to the fog in a chamber at a temperature of 50° C. for 24 hours. The test results are shown below:

| | Test 1 (Level 1 NiCr) | | | Test 1 (Level 2 NiCr) | | |
|---|---|---|---|---|---|---|
| | Before | After 4 days | Change | Before | After 4 days | Change |
| Transmitted color | | | | | | |
| Y | 19.13 | 19.01 | 0.11 | 18.12 | 17.95 | 0.17 |
| L* | 50.83 | 50.70 | −0.13 | 49.63 | 49.43 | −0.20 |
| a* | −0.65 | −0.97 | −0.33 | −0.63 | −0.95 | −0.32 |
| b* | −3.47 | −3.66 | −0.19 | −3.57 | −3.64 | −0.08 |
| ΔE | | 0.40 | | | 0.39 | |
| Glass surface reflected color | | | | | | |
| And | 29.92 | 30.03 | 0.10 | 31.44 | 31.20 | −0.24 |
| L* | 61.59 | 61.67 | 0.09 | 62.87 | 62.68 | −0.20 |
| a* | −3.15 | −3.07 | 0.09 | −3.10 | −2.97 | 0.12 |
| b* | −2.47 | −2.64 | −0.17 | −2.23 | −2.30 | −0.06 |
| ΔE | | 0.21 | | | 0.24 | |
| Film surface reflected color | | | | | | |
| Y | 53.10 | 57.79 | 4.70 | 54.67 | 59.49 | 4.82 |
| L* | 77.93 | 80.56 | 2.63 | 78.85 | 81.49 | 2.64 |
| a* | 1.90 | 2.05 | 0.15 | 2.26 | 2.21 | −0.05 |
| b* | 16.87 | 16.68 | −0.20 | 17.70 | 17.02 | −0.68 |
| ΔE | | 2.64 | | | 2.73 | |

| | Test 3 (Level 1 TiOx) | | | Test 4 (Level 2 TiOx) | | |
|---|---|---|---|---|---|---|
| | Before | After 4 days | Change | Before | After 4 days | Change |
| Transmitted color | | | | | | |
| And | 21.61 | 20.29 | 1.32 | 21.74 | 21.70 | 0.05 |
| L* | 53.60 | 52.13 | −1.48 | 53.75 | 53.70 | −0.04 |
| a* | −1.01 | −1.28 | −0.26 | −1.12 | −1.43 | −0.31 |
| b* | −4.19 | −4.16 | 0.02 | −4.57 | −4.73 | −0.16 |
| ΔE | | 1.50 | | | 0.35 | |
| Glass surface reflected color | | | | | | |
| Y | 28.60 | 29.46 | 0.86 | 27.50 | 27.49 | 0.00 |
| L* | 60.43 | 61.18 | 0.75 | 59.43 | 59.43 | 0.00 |
| a* | −3.02 | −3.02 | −0.01 | −2.88 | −2.84 | 0.04 |
| b* | −1.44 | −1.26 | 0.17 | −0.12 | −0.26 | −0.14 |
| ΔE | | 0.77 | | | 0.15 | |
| Film surface reflected color | | | | | | |
| Y | 48.74 | 55.16 | 6.42 | 48.17 | 52.33 | 4.16 |
| L* | 75.29 | 78.98 | 3.70 | 74.92 | 77.41 | 2.49 |
| a* | 2.63 | 2.57 | −0.06 | 2.80 | 2.86 | 0.05 |
| b* | 18.45 | 18.58 | 0.12 | 19.19 | 18.77 | −0.42 |
| ΔE | | 3.70 | | | 2.53 | |

As in the previous cases, the four configurations (tests 1, 2, 3 and 4) are highly resistant when exposed to the 0.026% bihidrated cupric chloride and 5% sodium chloride solution since all of them show slight transmission variations and all color parameters (ΔE) remain below 5.0 making it a stable product under these chemical attacks conditions.

To determine the level of adhesion of the film to glass, abrasion tests were performed according to the procedures described by ASTM D1044-08 standard, where a Taber® device is used and a weight of 300 gr is applied on the film-coated glass sheet by rotating the device 300 times. This test was performed on the annealed substrate because the required size of the sheet is 5×5 cm. A glass sheet of this size cannot be tempered with conventional production equipment. All tests showed a change in transmission less than 3.0, making them highly abrasion resistant films. Samples with NiCr show a better performance in this test compared with samples including TiOx. The results of abrasion tests on annealed sheet are shown below:

| Transmittance | Test 1 | Test 2 | Test 3 | Test 4 |
|---|---|---|---|---|
| Initial | 22.32 | 25.56 | 22.93 | 21.26 |
| Taber 1 | 22.82 | 25.92 | 23.47 | 23.48 |
| Taber 2 | 22.66 | 25.89 | 24.07 | 24.45 |
| Taber 3 | 22.96 | 25.56 | 23.36 | 23.17 |
| Taber 4 | 22.78 | 25.64 | 23.09 | 25.16 |
| Average | 22.80 | 25.75 | 23.50 | 24.07 |
| Change | 0.48 | 0.19 | 0.57 | 2.81 |
| % Abrasion | 2.14 | 0.76 | 2.48 | 13.21 |

Finally, to determine film thickness of samples 1, 2, 3 and 4, the methodology of preparation and characterization of samples for ultra-high resolution transmission electron microscope (TEM) was used, and for determining the composition energy discrimination spectroscopy (EDS) was used. The results shown in Tables 5 and 6 indicate the thicknesses of the coatings. Also the Al impurities in the $Si_4N_3$ film attributable to the type of cathode used may be seen. Non-stoichiometric ratios of materials are explained by the reactivity of the plasma with the materials.

With regard to determining the thermal performance of these examples, the NFRC (National Fenestration Rating Council) methodology was used, using the Optics6and/or Window6 software developed by Lawrence Berkeley National Laboratory, applicable to architectural and residential markets. The Model Cary 5000 spectrophotometer with Diffuse reflection accessory (DRA) was used to generate spectra.

TABLE 5

| | Film Thickness (nm) | | | | | Software Window 6 | | | | | |
|---|---|---|---|---|---|---|---|---|---|---|---|
| | $Si_yAl_zN_x$ | Nb | $Ni_xCr_y$ | $TiN_x$ | $Si_yAl_zN_x$ | % Tuv | % Tsol | % Tvis | % R vis Vid | % R vis Pel | Solar factor |
| EX 1 | 20 | 14 | 1 | 7 | 28 | 17.0 | 30.0 | 21.0 | 22.0 | 24.0 | 0.32 |
| EX 2 | 20 | 13 | 5 | 6 | 28 | 17.0 | 31.0 | 23.0 | 21.0 | 25.0 | 0.31 |

| | Transmitted color | | | Glass side reflected color | | | Film side reflected color | | |
|---|---|---|---|---|---|---|---|---|---|
| | L* | a* | b* | L* | a* | b* | L* | a* | b* |
| EX 1 | 54.3 | −2.1 | −2.3 | 60.4 | −3.8 | −3.2 | 55.3 | 1.4 | 15.5 |
| EX 2 | 53.2 | −2.3 | −2.5 | 62.5 | −3.8 | −1.9 | 56.9 | 1.6 | 16.7 |

TABLE 6

| | Film Thickness (nm) | | | | | Software Window 6 LBNL | | | | | |
|---|---|---|---|---|---|---|---|---|---|---|---|
| | $Si_yAl_zN_x$ | Nb | $Ni_xCr_y$ | $TiN_x$ | $Si_yAl_zN_x$ | % Tuv | % Tsol | % Tvis | % R vis Vid | % R vis Pel | Solar factor |
| EX 3 | 19 | 1 | 14 | 7 | 27 | 17.0 | 30.0 | 22.0 | 22.0 | 23.0 | 0.31 |
| Ex 4 | 21 | 10 | 14 | 7 | 27 | 18.0 | 31.0 | 18.0 | 24.0 | 26.0 | 0.32 |

| | Transmitted color | | | Glass side reflected color | | | Film side reflected color | | |
|---|---|---|---|---|---|---|---|---|---|
| | L* | a* | b* | L* | a* | b* | L* | a* | b* |
| Ex 3 | 54.1 | −2.4 | −2.8 | 61.6 | −3.7 | −2.8 | 54.9 | 2.0 | 17.3 |
| Ex 4 | 56.3 | −2.2 | −4.3 | 55.5 | −3.7 | 1.6 | 58.0 | 0.7 | 13.7 |

As shown in Examples 1 to 4, it is feasible to obtain an array of nanometric films applied on a glass substrate, whose function is a solar control glazing system, with mechanical strength and resistance to heat treatment characteristics.

In Examples 5 and 6 the effect of the Nb film thickness in light transmission and also the adjustment of the outer hue, which can range from blue with smaller thicknesses to a silver hue, passing by neutral as the thickness increases.

|  | Film Thickness (nm) | | | | | % Tuv | % Tsol | % Tvis | Software Window 6 % R vis Vid | % R vis Pel | Solar factor |
|---|---|---|---|---|---|---|---|---|---|---|---|
|  | Si$_y$Al$_z$N$_x$ | Nb | Ni$_x$Cr$_y$ | TiN$_x$ | Si$_y$Al$_z$N$_x$ | | | | | | |
| Ex 5 | 20 | 4 | 1 | 7 | 28 | 30.7 | 33.9 | 40.2 | 19.4 | 18.8 | 0.49 |
| Ex 6 | 20 | 32 | 5 | 6 | 28 | 4.6 | 7.2 | 9.2 | 39.7 | 30.4 | 0.25 |

|  | Transmitted color | | | Glass side reflected color | | | Film side reflected color | | |
|---|---|---|---|---|---|---|---|---|---|
|  | L* | a* | b* | L* | a* | b* | L* | a* | b* |
| Ex 5 | 69.7 | −2.2 | −2.4 | 51.3 | −3.5 | −4.7 | 50.2 | 0.5 | 8.2 |
| Ex 6 | 36.3 | −2.1 | 0.6 | 69.2 | −3.3 | 4.1 | 61.3 | 3.2 | 25.4 |

From the above, a coating on a substrate has been described with solar control properties and it will be apparent to those skilled in the art that other possible advances or improvements can be achieved, which may be considered within the field determined by the following claims.

We claim:

1. A method of manufacturing a substrate having a solar control coating comprising:
   providing a substrate;
   depositing a Si—Al compound to form a first dielectric layer comprising a first silicon nitride dielectric material over the substrate, wherein the first dielectric layer is deposited with nitrogen plasma;
   depositing a titanium diffusion barrier layer over the first dielectric layer in an inert atmosphere;
   depositing a metal layer formed from niobium over the diffusion barrier layer in an inert atmosphere;
   depositing titanium to form a titanium nitride metallic layer over the metal layer, wherein the titanium is deposited with nitrogen plasma; and
   depositing a Si—Al compound to form a second dielectric layer comprising a second silicon nitride dielectric material over the metallic layer, wherein the second dielectric layer is deposited with nitrogen plasma,
   wherein the substrate having the solar control coating has a visible light transmission from 5% to 60%, a solar transmission from 5% to 40%, and a solar factor of less than 0.5,
   wherein the diffusion barrier layer comprises TiO$_x$ with a thickness in the range of greater than 3 nm and less than 20 nm, and
   wherein a ΔE of the transmitted color of the substrate having the solar control coating is less than 5.0 after being subjected to an accelerated weathering test, where the ΔE of the transmitted color of the substrate with the solar control coating is calculated according to CIELAB (ISO 7724/3) where $\Delta E=[(\Delta L^*)^2+(\Delta a^*)^2+(\Delta b^*)^2]^{0.5}$.

2. The method of claim 1, wherein the first dielectric material and the second dielectric material comprise-Si$_3$N$_4$.

3. The method of claim 1, wherein the first dielectric layer has a thickness of 10 to 50 nm.

4. The method of claim 1, wherein the metal layer has a thickness of 2 nm to 40 nm.

5. The method of claim 1, wherein the metallic layer has a thickness of 5 nm to 20 nm.

6. The method of claim 1, and wherein the second dielectric layer has a thickness of 10 nm to 50 nm.

7. A method of manufacturing a substrate having a solar control coating comprising:
   providing a substrate;
   depositing a Si—Al compound to form a first dielectric layer comprising a first silicon nitride dielectric material over the substrate, wherein the first dielectric is deposited with nitrogen plasma;
   depositing a metal layer formed from niobium over the first dielectric layer in an inert atmosphere;
   depositing a protective layer formed from a nickel-chromium alloy over the metal layer in an inert atmosphere;
   depositing titanium to form a titanium nitride metallic layer over the protective layer, wherein the titanium is deposited with nitrogen plasma; and
   depositing a Si—Al compound to form a second dielectric layer comprising a second silicon nitride dielectric material over the metallic layer, wherein the second dielectric-layer deposited is with nitrogen plasma,
   wherein the second dielectric layer has a visible light transmission from 5% to 60%, a solar transmission from 5% to 40% and a solar factor of less than 0.5, and
   wherein a ΔE of the transmitted color of the substrate having the solar control coating is less than 5.0 after being subjected to an accelerated weathering test, where the ΔE of the transmitted color of the substrate with the solar control coating is calculated according to CIELAB (ISO 7724/3) where $\Delta E=[(\Delta L^*)^2+(\Delta a^*)^2+(\Delta b^*)^2]^{0.5}$.

8. The method of claim 7, wherein first dielectric material of the first dielectric layer comprises $Si_3N_4$.

9. The method of claim 7, wherein the second dielectric material of the second dielectric layer comprises $Si_3N_4$.

10. The method of claim 7, wherein the first dielectric layer has a thickness of 10 nm to 50 nm.

11. The method of claim 7, wherein the metal layer has a thickness of 2 nm to 40 nm.

12. The method of claim 7, wherein the protective layer has a thickness of 1 nm to 10 nm.

13. The method of claim 7, wherein the metallic layer has a thickness of 5 nm to 20 nm.

* * * * *